(12) United States Patent
Adachi (10) Patent No.: US 10,257,923 B2
(45) Date of Patent: Apr. 9, 2019

(54) RESIN SUBSTRATE AND ELECTRONIC DEVICE

(71) Applicant: Murata Manufacturing Co., Ltd., Nagaokakyo-shi, Kyoto-fu (JP)

(72) Inventor: Toshiro Adachi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/109,915

(22) Filed: Aug. 23, 2018

(65) Prior Publication Data

US 2018/0368254 A1   Dec. 20, 2018

Related U.S. Application Data

(63) Continuation of application No. PCT/JP2017/007010, filed on Feb. 24, 2017.

(30) Foreign Application Priority Data

Mar. 3, 2016 (JP) ................................. 2016-040554

(51) Int. Cl.
*H05K 1/11* (2006.01)
*H05K 1/02* (2006.01)
*H05K 3/46* (2006.01)
*H05K 1/03* (2006.01)
*H05K 1/09* (2006.01)
(Continued)

(52) U.S. Cl.
CPC ......... *H05K 1/0271* (2013.01); *H05K 1/0313* (2013.01); *H05K 1/092* (2013.01); *H05K 1/115* (2013.01); *H05K 3/0011* (2013.01); *H05K 3/4038* (2013.01); *H05K 3/46* (2013.01); *H05K 3/4644* (2013.01); *H05K 2201/068* (2013.01); *H05K 2201/095* (2013.01)

(58) Field of Classification Search
CPC .... H05K 1/0271; H05K 1/0313; H05K 1/115; H05K 1/092; H05K 3/0011; H05K 3/4038
USPC ........................................................ 174/257
See application file for complete search history.

(56) References Cited

U.S. PATENT DOCUMENTS

2016/0007460 A1    1/2016  Shimizu et al.

FOREIGN PATENT DOCUMENTS

JP   2009-152282 A   7/2009
JP   2014-199948 A   10/2014
(Continued)

OTHER PUBLICATIONS

Official Communication issued in International Patent Application No. PCT/JP2017/007010, dated May 16, 2017.

*Primary Examiner* — Tremesha S Willis
(74) *Attorney, Agent, or Firm* — Keating & Bennett, LLP (57) ABSTRACT

A resin substrate includes a first portion including a plurality of resin sheets provided at one end in a stacking direction and a second portion including a plurality of resin sheets provided at the other end in the stacking direction. The thickness of the plurality of resin sheets is the same or substantially the same as the thickness of the first portion and the second portion. The density of planar conductor patterns of the first portion with respect to the volume of the first portion is lower than the density of planar conductor patterns of the second portion with respect to the volume of the second portion. The average of the diameters of the first interlayer connection conductor provided in the first portion is greater than the average of the diameters of the second
(Continued)

interlayer connection conductor provided in the second portion.

18 Claims, 7 Drawing Sheets

(51) Int. Cl.
    *H05K 3/00*         (2006.01)
    *H05K 3/40*         (2006.01)

(56)         References Cited

FOREIGN PATENT DOCUMENTS

| | | |
|---|---|---|
| JP | 5660462 B2 | 1/2015 |
| JP | 2016-018858 A | 2/2016 |

PRIOR ART

FIG.7

RESIN SUBSTRATE AND ELECTRONIC DEVICE

CROSS REFERENCE TO RELATED APPLICATIONS

This application claims the benefit of priority to Japanese Patent Application No. 2016-040554 filed on Mar. 3, 2016 and is a Continuation Application of PCT Application No. PCT/JP2017/007010 filed on Feb. 24, 2017. The entire contents of each application are hereby incorporated herein by reference.

BACKGROUND OF THE INVENTION

1. Field of the Invention

The present invention relates to a resin substrate in which a plurality of resin sheets are stacked on each other, and to an electronic device including such a resin substrate.

2. Description of the Related Art

At present, various types of resin substrates are used for an electronic component. A resin substrate disclosed in Japanese Patent No. 5660462 is obtained by stacking a plurality of resin sheets. The plurality of resin sheets include conductor patterns. According to the configuration, the conductor patterns are provided on a plurality of layers of the resin substrate.

The conductor patterns provided on different layers are connected by an interlayer connection conductor. According to the configuration, the conductor patterns of the plurality of layers are electrically connected to each other.

Figure 7:
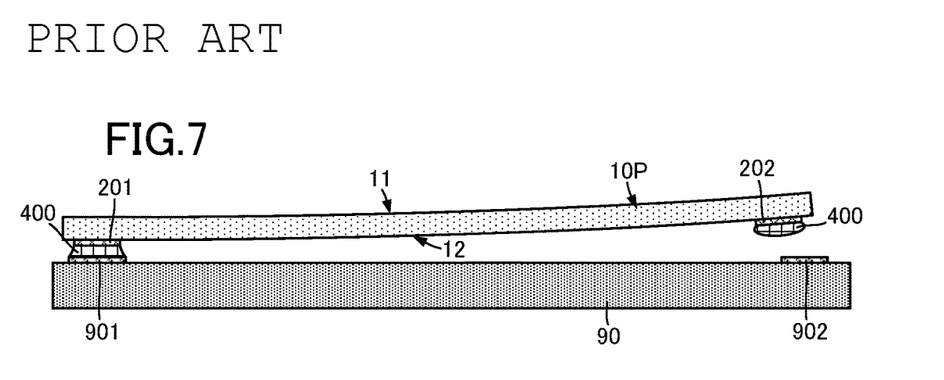
FIG. 7 is a side view illustrating a conventional resin substrate.

A conventional resin substrate shows the following subject. FIG. 7 is a side view illustrating the structure of a conventional resin substrate to show the subject.

A resin substrate 10P is a flat plate having an elongated outer shape. External connection conductors 201 and 202 are provided on the reverse surface 12 of the resin substrate 10P. The external connection conductor 201 is provided at one end in the length direction. The external connection conductor 202 is provided at the other end in the length direction.

In this resin substrate 10P, in the thickness direction of the resin substrate 10P, the density of the conductor patterns in a plurality of layers on the side of the front surface 11 of the resin substrate 10P is lower than the density of the conductor patterns in a plurality of layers on the side of the reverse surface 12 of the resin substrate 10P.

In a case in which such a resin substrate 10P is surface-mounted on a printed wiring board 90, the external connection conductors 201 and 202 are bonded to land conductors 901 and 902 of the printed wiring board 90 with solder 400, respectively. However, when the density of the conductor patterns on the side of the front surface 11 is lower than the density of the conductor patterns on the side of the reverse surface, as shown in FIG. 7, by a thermal history at the time of reflow during surface mounting or the like, the front surface 11 of the resin substrate 10P shrinks and warps. Therefore, as shown in FIG. 7, for example, even when the external connection conductor 201 is able to be bonded to the land conductor 901, a mounting failure such that the external connection conductor 202 is not able to be bonded to the land conductor 902 may occur. In particular, as shown in FIG. 7, in a case in which the resin substrate 10P has an elongated shape and the external connection conductors 201 and 202 are provided on both ends in the length direction, the influence of warpage is increased, and the mounting failure is more likely to occur.

SUMMARY OF THE INVENTION

Preferred embodiments of the present invention provide resin substrates each capable of significantly reducing or preventing warpage mainly due to a thermal history.

A resin substrate according to a preferred embodiment of the present invention includes a plurality of resin sheets including a conductor pattern having a planar or substantially planar shape, the plurality of resin sheets being stacked on one another and extending in a longitudinal direction, the plurality of resin sheets including a first end and a second end in a stacking direction in which the plurality of resin sheets are stacked on one another, and includes the following features. The resin substrate includes an interlayer connection conductor provided in the plurality of resin sheets, and an external connection conductor. The plurality of resin sheets include a first portion including a first group of resin sheets of the plurality of resin sheets that are provided closer to the first end than to the second end; and a second portion including a second group of resin sheets of the plurality of resin sheets that are provided closer to the second end than to the first end. The density of the conductor pattern of the first portion with respect to the volume of the first portion is lower than the density of the conductor pattern of the second portion with respect to the volume of the second portion. The interlayer connection conductor includes a first interlayer connection conductor provided at the first portion and having a plurality of diameters; and a second interlayer connection conductor provided at the second portion and having a plurality of diameters; the average of the plurality of diameters of the first interlayer connection conductor provided in the first portion is greater than the average of the plurality of diameters of the second interlayer connection conductor provided in the second portion. The external connection conductor is provided at the second end. The first portion includes the plurality of first interlayer connection conductors. The plurality of first interlayer connection conductors respectively include surfaces on which the conductor pattern is not provided. The plurality of first interlayer connection conductors are connected on the surfaces.

With this configuration, the difference in density of planar conductor patterns between the first portion and the second portion that are arranged in the thickness direction of the resin substrate is reduced by the difference between the size of the diameter of the first interlayer connection conductor, and the size of the diameter of the second interlayer connection conductor.

In addition, a resin substrate according to a preferred embodiment of the present invention may preferably have the following configuration. Based on the density of the conductor pattern of the second portion and the second interlayer connection conductor with respect to the volume of the second portion, a ratio of the density of the conductor pattern of the first portion and the first interlayer connection conductor with respect to the volume of the first portion may be greater than or equal to about 0.5 and less than or equal to about 1.0.

With this configuration, the difference in density between the first portion and the second portion is significantly reduced, and warpage is further easily reduced.

In addition, in a resin substrate according to a preferred embodiment of the present invention, a plurality of resin sheets may be made of a thermoplastic resin. With this configuration, a resin substrate is easily structured by a plurality of resin sheets.

In addition, a resin substrate according to a preferred embodiment of the present invention may have an elongated outer shape extending in the longitudinal direction. With this configuration, the effect of significantly reducing warpage of the configuration according to a preferred embodiment of the present invention becomes more effective.

In addition, an electronic device according to a preferred embodiment of the present invention includes a resin substrate including a plurality of resin sheets including a conductor pattern having a planar or substantially planar shape, the plurality of resin sheets being stacked on one another and extending in a longitudinal direction, the plurality of resin sheets including a first end and a second end in a stacking direction in which the plurality of resin sheets are stacked on one another and includes the following features. The resin substrates include an interlayer connection conductor provided in the plurality of resin sheets and an external connection conductor. The plurality of resin sheets include a first portion defined by the plurality of resin sheets that are provided closer to the first end than to the second end in the stacking direction of the plurality of resin sheets; and a second portion defined by the plurality of resin sheets that are provided closer to the second end than to the first end in the stacking direction of the plurality of resin sheets. The density of the conductor pattern of the first portion with respect to the volume of the first portion is lower than the density of the conductor pattern of the second portion with respect to the volume of the second portion. The interlayer connection conductor includes a first interlayer connection conductor provided at the first portion and having a plurality of diameters; the interlayer connection conductor also includes a second interlayer connection conductor provided at the second portion and having a plurality of diameters. The average of the plurality of diameters of the first interlayer connection conductor provided in the first portion is greater than the average of the plurality of diameters of the second interlayer connection conductor provided in the second portion. The external connection conductor is provided at the second end. The first portion includes a plurality of first interlayer connection conductors. The plurality of first interlayer connection conductors respectively include surfaces on which the conductor pattern is not provided. The plurality of first interlayer connection conductors are connected on the surfaces. The external connection conductor is connected to an external substrate With this configuration, in the electronic device including the plurality of resin substrates, the difference in density of planar conductor patterns between the first portion and the second portion that are arranged in the thickness direction of the resin substrate is reduced by the difference between the size of the diameter of the first interlayer connection conductor, and the size of the diameter of the second interlayer connection conductor.

According to various preferred embodiments of the present invention, warpage of resin substrates due to a thermal history or the like is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
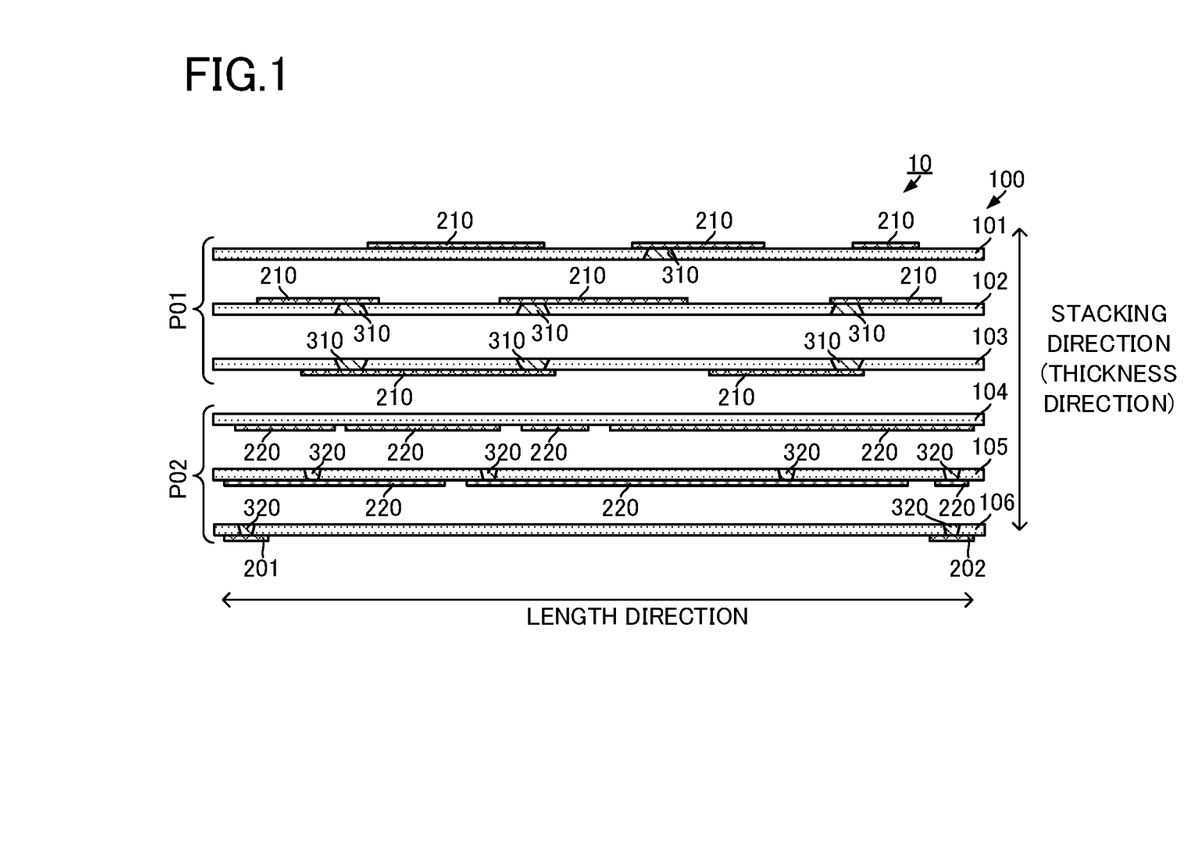
FIG. 1 is an exploded cross-sectional view of a resin substrate according to a preferred embodiment of the present invention.
Figure 2:
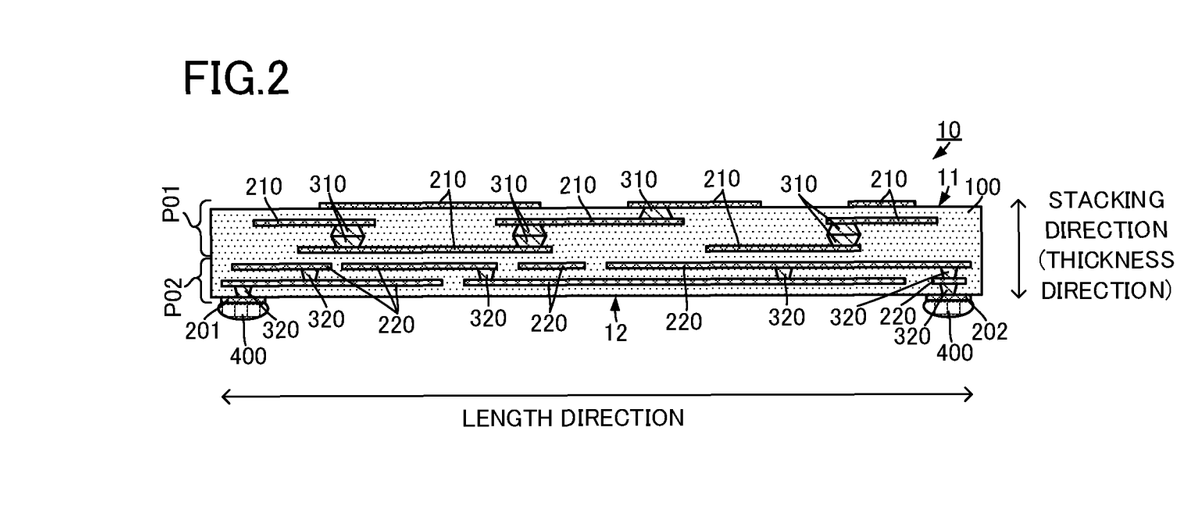
FIG. 2 is a cross-sectional view of a resin substrate according to a preferred embodiment of the present invention.
Figure 3:
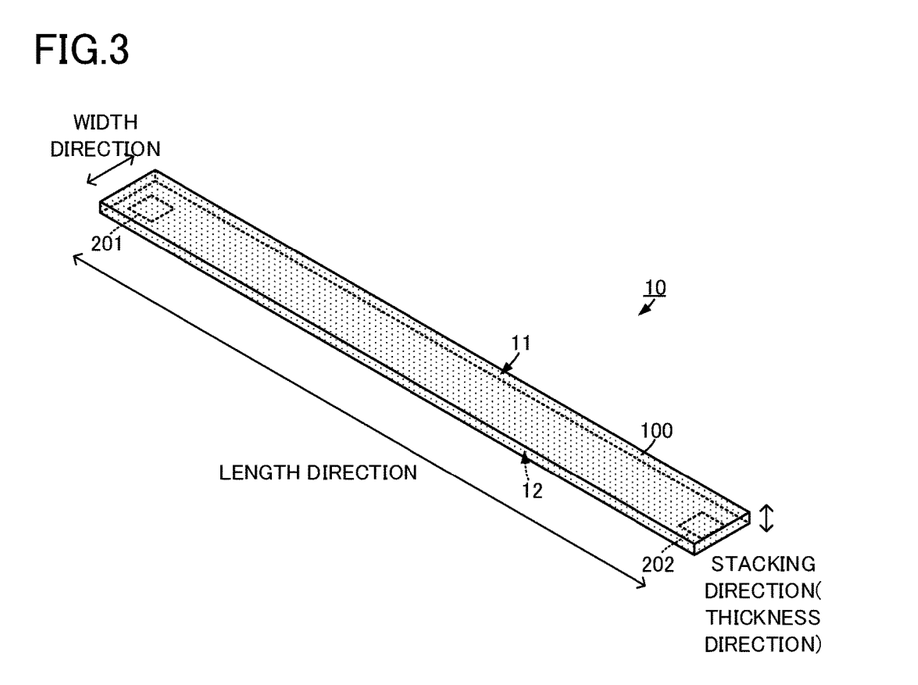
FIG. 3 is an external perspective view of a resin substrate according to a preferred embodiment of the present invention.
Figure 4A:
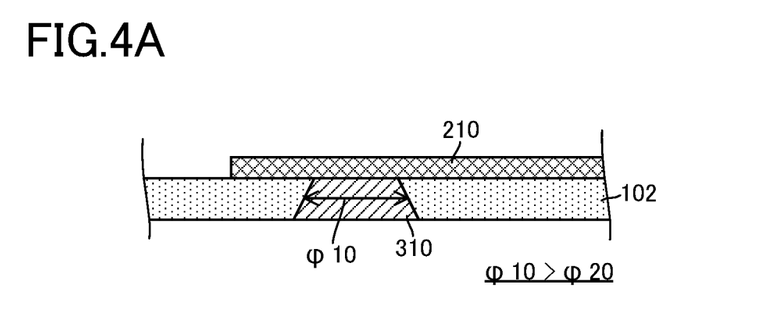
FIG. 4A is a cross-sectional view of a shape of a first interlayer connection conductor of a resin substrate according to a preferred embodiment of the present invention.
Figure 4B:
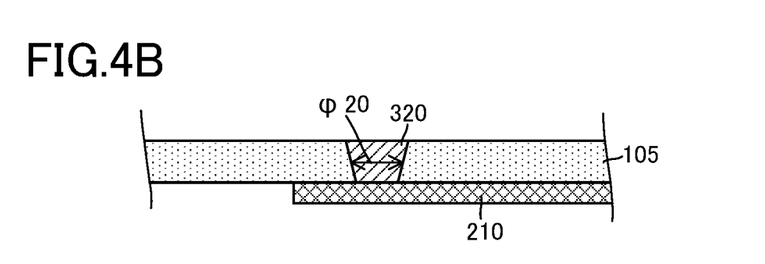
FIG. 4B is a cross-sectional view of a shape of a second interlayer connection conductor of a resin substrate according to a preferred embodiment of the present invention.

Resin substrates according to preferred embodiments of the present invention will be described with reference to the drawings. FIG. 1 is an exploded cross-sectional view of a resin substrate 10 according to a preferred embodiment of the present invention. FIG. 2 is a cross-sectional view of the resin substrate 10 according to a preferred embodiment of the present invention. FIG. 3 is an external perspective view of the resin substrate 10 according to a preferred embodiment of the present invention. FIG. 4A is an enlarged cross-sectional view of a shape of a first interlayer connection conductor 310 of the resin substrate 10 according to a preferred embodiment of the present invention, and FIG. 4B is an enlarged cross-sectional view of a shape of the second interlayer connection conductor 320 of the resin substrate 10 according to a preferred embodiment of the present invention. It is to be noted that FIG. 1, FIG. 2, and FIGS. 4A and 4B show the resin substrate 10 with emphasis on thickness.

As shown in FIG. 1, FIG. 2, and FIG. 3, the resin substrate 10 is a flat plate. The dimension of the resin substrate 10 in the length direction is much larger than the dimension of the resin substrate 10 in the width direction. In other words, the length direction of the resin substrate 10 is the longitudinal direction. Then, resin substrate 10 is a flat plate having an elongated outer shape. It is to be noted that the configuration of the present preferred embodiment is effectively applied to a resin substrate in which the dimension in the length direction is longer than the dimension in the width direction and the dimension in the length direction is longer than or equal to a predetermined value. For example, it is more effective when the dimension in the length direction is more than about twice the dimension in a width direction.

The resin substrate 10 includes a main body 100, external connection conductors 201 and 202, conductor patterns 210 and 220, and interlayer connection conductors 310 and 320. The resin substrate 10 includes a first end (one end) and a second end (the other end) in the length direction, and the external connection conductor 201 is provided at the first end. The external connection conductor 202 is provided at the second end. The external connection conductors 201 and 202 are provided on the reverse surface 12 of the resin substrate 10.

The main body 100 includes a plurality of resin sheets 101, 102, 103, 104, 105, and 106 (hereinafter referred to as 101 to 106). The main body 100 is a stacked body including the plurality of resin sheets 101 to 106. The resin sheets 101 to 106 preferably have the same or substantially same thickness. The resin sheets 101 to 106 are preferably made of the same material, and made of a thermoplastic resin, for example.

As shown in FIG. 1, each of the resin sheets 101, 102, and 103 includes a conductor pattern 210 having a planar or substantially planar shape. More specifically, the resin sheet 101 includes the conductor pattern 210 on a front surface 11 (one end as a first end in the stacking direction) of the resin sheet 101. In addition, the resin sheet 102 includes the conductor pattern 210 on the side of the front surface 11. In other words, the interlayer connection conductor 310 of the resin sheet 102 include one surface on the side of the from surface 11, on which the conductor pattern 210 is provided and another surface 311 on the side of a reverse surface 12 (the other end as a second end in the stacking direction), on which the conductor pattern 210 is not provided. Further, the resin sheet 103 includes the conductor pattern 210 on the side of a reverse surface 12 of the resin sheet 103. In other words, the interlayer connection conductor 310 of the resin sheet 103 includes one surface 311 on the side of the from surface 11, on which the conductor pattern 210 is not provided and another surface on the side of a reverse surface 12, on which the conductor pattern 210 is provided.

The resin sheet 101 and the resin sheet 102 are provided such that surfaces on which the conductor pattern 210 is not provided face each other in the stacking direction. The conductor pattern 210 is preferably made of a material with high conductivity, for example, copper foil. Each of the resin sheets 101, 102, and 103 includes an interlayer connection conductor 310. The interlayer connection conductor 310 corresponds to a "first interlayer connection conductor". The interlayer connection conductor 310 is preferably obtained by solidifying conductive paste, for example. The conductive paste is obtained by mixing metal powder, an organic solvent, and other ingredients. The conductor pattern 210 of the resin sheet 101 and the conductor pattern 210 of the resin sheet 102 are connected to each other by the interlayer connection conductor 310 of the resin sheet 101. The conductor pattern 210 of the resin sheet 102 and the conductor pattern 210 of the resin sheet 103 are connected to each other by the interlayer connection conductors 310 of the resin sheet 102 and 103.

In other words, the surfaces 311 of two interlayer connection conductors 310 that overlap in the stacking direction are connected to each other. The surfaces 311 are not surfaces on which the conductor pattern 210 is provided. The two interlayer connection conductors 310 that overlap in the stacking direction are directly connected to each other, so that it is not necessary to provide a conductor pattern between the two interlayer connection conductors 310 and, thus, the thickness of a resin substrate is able to be reduced.

Each of the resin sheets 104 and 105 includes a conductor pattern 220 having a planar or substantially planar shape. The conductor pattern 220, similar to the conductor pattern 210, is preferably made of a material with high conductivity, for example, copper foil. The resin sheet 105 includes an interlayer connection conductor 320. The interlayer connection conductor 320, similar to the interlayer connection conductor 310, is preferably obtained by solidifying conductive paste, for example. The conductor pattern 220 of the resin sheet 104 and the conductor pattern 220 of the resin sheet 105 are connected to each other by the interlayer connection conductor 320 of the resin sheet 105.

The resin sheet 106 includes external connection conductors 201 and 202. The external connection conductors 201 and 202, similar to the conductor patterns 210 and 220, are preferably made of a material with high conductivity, for example, copper foil. The resin sheet 106 includes an interlayer connection conductor 320. The interlayer connection conductor 320 provided in the resin sheet 106, similar to the interlayer connection conductor 310, is preferably obtained by solidifying conductive paste, for example. The interlayer connection conductor 320 corresponds to a "second interlayer connection conductor".

The conductor patterns 210 and 220 and the interlayer connection conductors 310 and 320 are appropriately provided and define an electric circuit on the resin substrate 10. This electric circuit includes one input and output terminal defined by the external connection conductor 201 and the other input and output terminal defined by the external connection conductor 202.

According to such a configuration, as shown in FIG. 1 and FIG. 2, the resin substrate 10 includes a first portion P01 including the resin sheets 101, 102, and 103, and a second portion P02 including the resin sheets 104, 105, and 106 in the stacking direction (the thickness direction), and further includes an end surface on the side of the front surface 11, and an end surface on the reverse surface 12. The first portion P01 is a portion including the resin sheets 101 to 103 closer to the end surface on the side of the front surface 11 than to the end surface on the side of the reverse surface 12 in the stacking direction. The second portion P02 is a portion including the resin sheets 104 to 106 closer to the end surface on the side of the reverse surface 12 than to the end surface on the side of the front surface 11 in the stacking direction. In other words, in the resin substrate 10, the first portion P01 and the second portion P02 are disposed in this order from the side of the front surface 11 (one end as the first end in the stacking direction) toward the side of the reverse surface 12 (the other end as the second end in the stacking direction).

The density of the conductor pattern 210 of the first portion P01 is lower than the density of the conductor pattern 220 of the second portion P02. In other words, the density of the conductor pattern 210 of the first portion P01 with respect to the volume of the first portion P01 is lower than the density of the conductor pattern 220 of the second portion P02 with respect to the volume of the second portion P02.

On the other hand, as shown in FIGS. 4A and 4B, the diameter $\varphi 10$ of the interlayer connection conductor 310 in the first portion P01 is larger than the diameter $\varphi 20$ of the interlayer connection conductor 320 in the second portion P02. In other words, the diameters satisfy the relationship of $\varphi 10 > \varphi 20$. It is to be noted that, in the present preferred embodiment, the interlayer connection conductors 310 and 320 preferably have, for example, an inverted circular cone shape, as shown in FIGS. 4A and 4B. Therefore, the diameters of the interlayer connection conductors 310 and 320 change along the thickness direction. In such a case, the diameters of the interlayer connection conductors 310 and 320 indicate a diameter at an intermediate position in the thickness direction of the interlayer connection conductors 310 and 320.

It is to be noted that the diameters of all of the interlayer connection conductors 310 in the first portion P01 may not be larger than the diameters of all of the interlayer connection conductors 320 in the second portion P02. For example, the diameters of all interlayer connection conductors in the first portion P01 do not have to be constant, and the diameters of all interlayer connection conductors in the second portion P02 do not have to be constant. In such a case, the average value of the diameters of all interlayer connection conductors 310 in the first portion P01 may be greater than the average value of the diameters of all interlayer connection conductors 320 in the second portion P02.

With such a configuration, the difference between the density of the conductors (the conductor pattern 210 and the interlayer connection conductor 310) in the first portion P01 and the density of the conductors (the conductor pattern 220 and the interlayer connection conductor 320) in the second portion P02 is reduced. As a result, warpage due to the thermal history of the resin substrate 10 is able to be significantly reduced or prevented. Therefore, the warpage of the resin substrate 10 when heat is added by reflow or other suitable process at the time of surface mounting is able to be significantly reduced or prevented, and, when the resin substrate 10 is surface-mounted on the printed wiring board 90, the resin substrate 10 is able to be more surely mounted on the printed wiring board 90.

In particular, based on the density of the conductors (the conductor pattern 220 and the interlayer connection conductor 320) in the second portion P02, the density of the conductors (the conductor pattern 210 and the interlayer connection conductor 310) in the first portion P01 is preferably about 0.5 or more and about 1.0 or less, for example, which further improves the effect of reducing warpage.

It is to be noted that, in a case in which the thicknesses of the resin sheets are different, even when the same hole is to be provided in the resin sheets, the hole in a thick resin sheet is larger than the hole in a thin resin sheet. However, the relationship between the diameter φ10 of the interlayer connection conductor 310 of the first portion P01 and the diameter φ20 of the interlayer connection conductor 320 of the second portion P02 according to the present preferred embodiment is not based on such a principle but is purposely set in order to make the density of the conductors in the first portion P01 closer to the density of the conductors in the second portion P02.

In addition, the interlayer connection conductor 310 that connects the conductor pattern 210 of the resin sheet 102 and the conductor pattern 210 of the resin sheet 103 is provided so that surfaces with a larger diameter may preferably be connected to each other.

Figure 5:
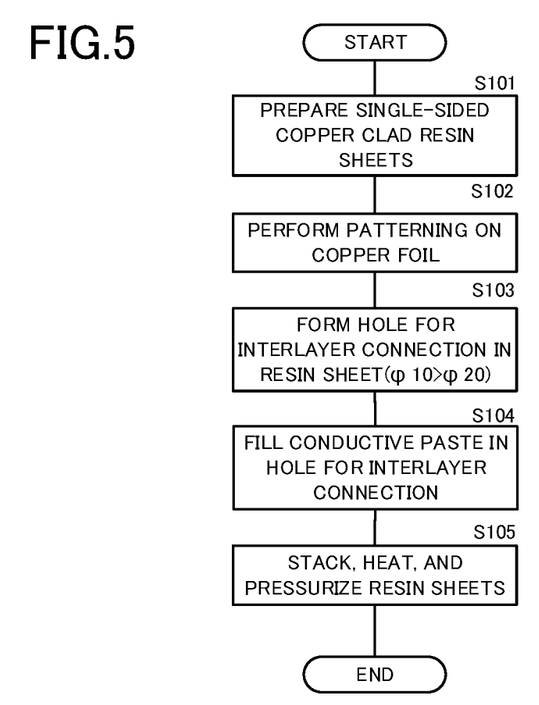
FIG. 5 is a flow chart of steps of manufacturing a resin substrate according to a preferred embodiment of the present invention.
Figure 6A:
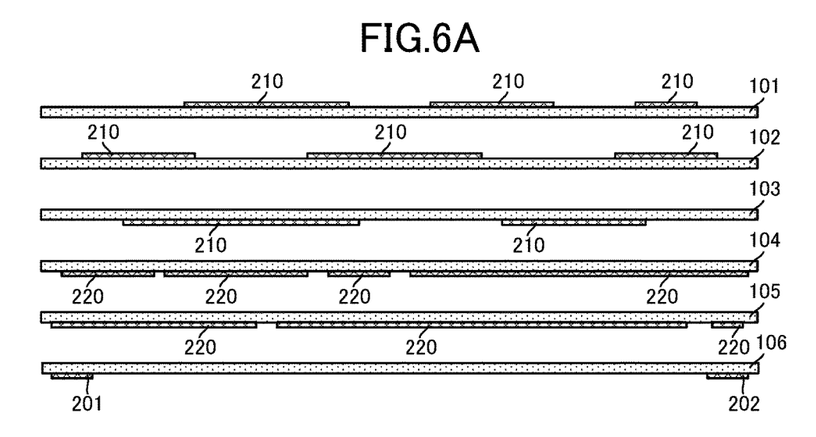
FIG. 6A is exploded a cross-sectional view of a shape in the middle of manufacturing a resin substrate according to a preferred embodiment of the present invention.
Figure 6B:
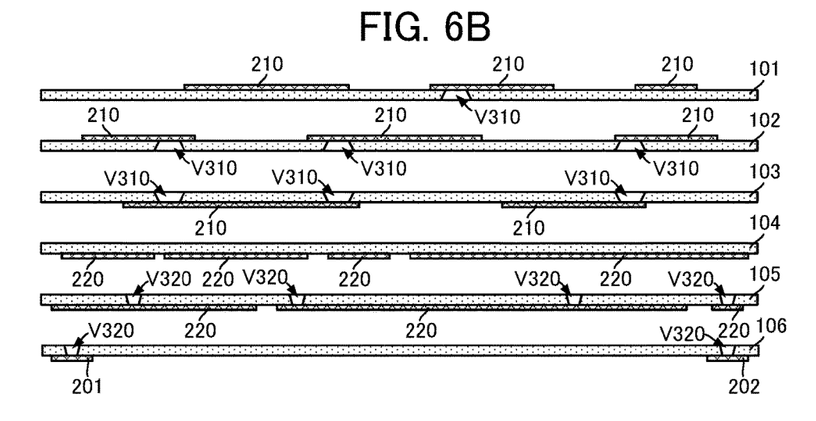
FIG. 6B is an exploded cross-sectional view of a different shape, from FIG. 6A, in the middle of manufacturing a resin substrate according to a preferred embodiment of the present invention.

The resin substrate 10 having such a configuration is manufactured by the following steps. FIG. 5 is a flow chart of steps of manufacturing the resin substrate 10 according to the present preferred embodiment of the present invention. FIGS. 6A and 6B are exploded cross-sectional views of a shape in the middle of manufacturing the resin substrate 10 according to the present preferred embodiment of the present invention.

To begin with, a single-sided copper clad resin sheet is prepared for the number of stacked layers of a resin substrate 10 (S101). The resin sheet is made of a thermoplastic resin.

Subsequently, copper foil is patterned using a technique, such as photolithography (S102), for example. As a result, as shown in FIG. 6A, the conductor pattern 210 is formed on the resin sheets 101, 102, and 103, the conductor pattern 220 is formed on the resin sheets 104 and 105, and the external connection conductors 201 and 202 are formed on the resin sheet 106.

Subsequently, a hole is formed with laser or other suitable method in the resin sheets 101 to 106 (S103). As a result, as shown in FIG. 6B, a hole V310 for interlayer connection is formed in the resin sheets 101, 102, and 103, and a hole V320 for interlayer connection is formed in the resin sheets 104, 105, and 106. At this time, the diameter φ10 of the hole V310 is larger than the diameter φ20 of the hole V320.

Subsequently, the holes V310 and V320 for interlayer connection are filled up with conductive paste (S104). The conductive paste is formed, for example, by mixing metal powder of Sn as a main component, one or more kinds of metal or alloy selected from Cu, Ni, Ag, and Mo as an accessory component, an organic solvent, and other suitable ingredients.

Subsequently, the resin sheets 101 to 106 are stacked on one another, and are heated and pressurized (S105). This heating bonds the resin sheets 101 to 106. In addition, the conductive paste is solidified, so that the interlayer connection conductors 310 and 320 are formed. As a result, the resin substrate 10 is formed.

In this manner, with the manufacturing method of the present preferred embodiment, the resin substrate 10 capable of significantly reducing or preventing warpage due to a thermal history is able to be easily manufactured.

It is to be noted that the resin sheets 101 to 106 are not limited to a thermoplastic resin. However, with use of thermoplastic resin sheets 101 to 106, the resin substrate 10 is able to be formed without intervening other materials, such as an adhesive material, between the resin sheets 101 to 106. As a result, warpage due to differences in deformation between materials is able to be more reliably reduced or prevented.

In addition, in the foregoing description, a preferred embodiment in which the first portion P01 includes the three resin sheets 101 to 103, and the second portion P02 includes the three resin sheets 104 to 106 is illustrated. However, each of the first portion P01 may include 2 or more resin sheets. The second portion P02 may include at least one resin sheet. In addition, the number of resin sheets of the first portion P01 and the number of resin sheets of the second portion P02 may not be equal.

In addition, while, in the foregoing description, the resin substrate 10 in which the conductor patterns 210 and 220 having a planar or substantially planar shape are provided on all of the resin sheets (the resin sheets 101, 102, 103, 104, 105, and 106), the conductor pattern having a planar or substantially planar shape may not be provided on some of the resin sheets. In addition, the interlayer connection conductor may not be provided in some of the resin sheets. Further, in either one of the first portion P01 and the second portion P02, the conductor pattern having a planar or substantially planar shape may not be included at all.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a plurality of resin sheets including a conductor pattern having a planar or substantially planar shape, the plurality of resin sheets being stacked on one another and extending in a longitudinal direction, the plurality of resin sheets including a first end and a second end in a stacking direction in which the plurality of resin sheets are stacked on one another;
an interlayer connection conductor provided in the plurality of resin sheets; and
an external connection conductor; wherein
the plurality of resin sheets include:
   a first portion including a first group of resin sheets of the plurality of resin sheets that are closer to the first end than to the second end; and
   a second portion including a second group of resin sheets of the plurality of resin sheets that are closer to the second end than to the first end;
a density of the conductor pattern of the first portion with respect to a volume of the first portion is lower than a density of the conductor pattern of the second portion with respect to a volume of the second portion;
the interlayer connection conductor includes:
   a first interlayer connection conductor provided at the first portion and including a plurality of diameters; and
   a second interlayer connection conductor provided at the second portion and including a plurality of diameters;
an average of the plurality of diameters of the first interlayer connection conductor is greater than an average of the plurality of diameters of the second interlayer connection conductor;
the external connection conductor is provided at the second end;
the first portion includes a plurality of the first interlayer connection conductors;
the plurality of first interlayer connection conductors respectively include surfaces on which the conductor pattern is not provided; and
the plurality of first interlayer connection conductors are connected on the surfaces.

2. The resin substrate according to claim 1, wherein, based on a density of the conductor pattern of the second portion and the second interlayer connection conductor with respect to the volume of the second portion, a ratio of a density of the conductor pattern of the first portion and the plurality of first interlayer connection conductors with respect to the volume of the first portion is greater than or equal to about 0.5 and less than or equal to about 1.0.

3. The resin substrate according to claim 1, wherein the plurality of resin sheets are made of a thermoplastic resin.

4. The resin substrate according to claim 1, wherein the resin substrate includes an elongated outer shape extending in the longitudinal direction.

5. The resin substrate according to claim 1, wherein a dimension of the resin substrate in the longitudinal direction is at least about twice a dimension of the resin substrate in a width direction perpendicular or substantially perpendicular to the longitudinal direction.

6. The resin substrate according to claim 1, wherein the plurality of resin sheets have a same or substantially a same thickness as one another.

7. The resin substrate according to claim 1, wherein the conductor pattern includes a copper foil.

8. The resin substrate according to claim 1, wherein each of the first and second interlayer connection conductors has an inverted circular cone shape.

9. The resin substrate according to claim 1, wherein the first and second interlayer connection conductors include a solidifying conductive paste.

10. An electronic device comprising:
a resin substrate; wherein
the resin substrate includes:
   a plurality of resin sheets including a conductor pattern with a planar or substantially planar shape, the plurality of resin sheets being stacked on one another and extending in a longitudinal direction, the plurality of resin sheets including a first end and a second end in a stacking direction in which the plurality of resin sheets are stacked on one another;
   an interlayer connection conductor provided in the plurality of resin sheets; and
   an external connection conductor; wherein
   the plurality of resin sheets includes:
      a first portion including a first group of resin sheets of the plurality of resin sheets that are closer to the first end than to the second end; and
      a second portion including a second group of resin sheets of the plurality of resin sheets that are closer to the second end than to the first end;
   a density of the conductor pattern of the first portion with respect to a volume of the first portion is lower than a density of the conductor pattern of the second portion with respect to a volume of the second portion;
   the interlayer connection conductor includes:
      a first interlayer connection conductor provided at the first portion and including a plurality of diameters; and
      a second interlayer connection conductor provided at the second portion and including a plurality of diameters;
   an average of the plurality of diameters of the first interlayer connection conductor is greater than an average of the plurality of diameters of the second interlayer connection conductor;
   the external connection conductor is provided at the second end;
   the first portion includes a plurality of the first interlayer connection conductors;
   the plurality of first interlayer connection conductors respectively include surfaces on which the conductor pattern is not provided;
   the plurality of first interlayer connection conductors are connected on the surfaces; and
the external connection conductor is connected to an external substrate.

11. The electronic device according to claim 10, wherein, based on a density of the conductor pattern of the second portion and the second interlayer connection conductor with respect to the volume of the second portion, a ratio of a density of the conductor pattern of the first portion and the plurality of first interlayer connection conductors with respect to the volume of the first portion is greater than or equal to about 0.5 and less than or equal to about 1.0.

12. The electronic device according to claim 10, wherein the plurality of resin sheets are made of a thermoplastic resin.

13. The electronic device according to claim 10, wherein the resin substrate includes an elongated outer shape extending in the longitudinal direction.

14. The electronic device according to claim 10, wherein a dimension of the resin substrate in the longitudinal direction is at least about twice a dimension of the resin substrate in a width direction perpendicular or substantially perpendicular to the longitudinal direction.

15. The electronic device according to claim 10, wherein the plurality of resin sheets have a same or substantially a same thickness as one another.

16. The electronic device according to claim 10, wherein the conductor pattern includes a copper foil.

17. The electronic device according to claim 10, wherein each of the first and second interlayer connection conductors has an inverted circular cone shape.

18. The electronic device according to claim 10, wherein the first and second interlayer connection conductors include a solidifying conductive paste.

* * * * *